CONSTANT CURRENT GAIN COMPOSITE TRANSISTOR

Filed Feb. 7, 1966

WITNESSES:
John G. Chopp
James F. Young

INVENTORS
Hung C. Lin and
Melbourne J. Hellstrom
BY Dean Schron
ATTORNEY

United States Patent Office 3,391,311

Patented July 2, 1968

3,391,311
CONSTANT CURRENT GAIN COMPOSITE TRANSISTOR

Hung C. Lin, Silver Spring, and Melbourne J. Hellstrom, Severna Park, Md., assignors to Westinghouse Electric Corporation, Pittsburgh, Pa., a corporation of Pennsylvania Filed Feb. 7, 1966, Ser. No. 525,593
6 Claims. (Cl. 317—235)

Figure 1:
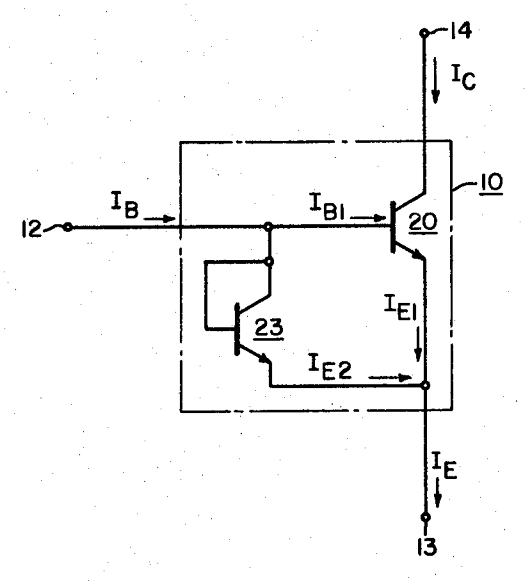

This invention in general relates to transistors, and more particularly, to a constant current gain transistor device.

For many circuit applications it is desired to have a transistor with a current gain that remains constant over a wide temperature and operating current range. The common emitter forward current gain $\beta$ can vary with the geometry of the transistor, the doping applied in the fabrication, variations in collector current and changes in the temperature, and very often the $\beta$ of a transistor can vary by as much as 2:1. Generally, maintaining a constant current gain is accomplished by a feedback mechanism incorporating resistance degeneration by the use of a series resistor feedback or a shunt resistor feedback scheme. The inclusion of feedback resistors introduces resistance and causes and unwanted power dissipation which is particularly undesirable where the transistor is fabricated as part of an integrated circuit.

It is, therefore, a primary object of the present invention to provide a composite transistor device which will experience a substantially constant current gain over a wide range of fabricating and operating parameters.

It is a further object to provide a composite transistor having a substantially constant current gain without the use of power dissipating resistors.

A further object is to provide a composite transistor which is particularly well adapted to be fabricated as an integrated circuit.

Briefly, in accordance with the above objects, the composite transistor of the present invention includes a transistor having a base, emitter and collector electrode connected to first, second and third circuit points respectively. Connected in parallel with the base-emitter diode of the transistor is a unidirectional semiconductor device poled for conduction in the same direction as the base-emitter diode of the transistor. The semiconductor device includes a p-n junction of a certain area such that the current through the semiconductor device is proportional to the emitter current of the transistor. The three circuit points can be considered to be connected to the base, emitter and collector of the composite transistor which includes the semiconductor device, and the current gain of the composite transistor is substantially equal to the ratio of the transistor emitter current to the semiconductor device current.

The base emitter-diode of the transistor and the semiconductor device are connected so that the voltage across the one is always equal to the voltage across the other to maintain equal current densities. Therefore, as the emitter area of the transistor is in proportion to the corresponding junction area of the semiconductor device, so is the ratio of the two currents; and consequently the current gain of the composite transistor, is established.

Figure 2:
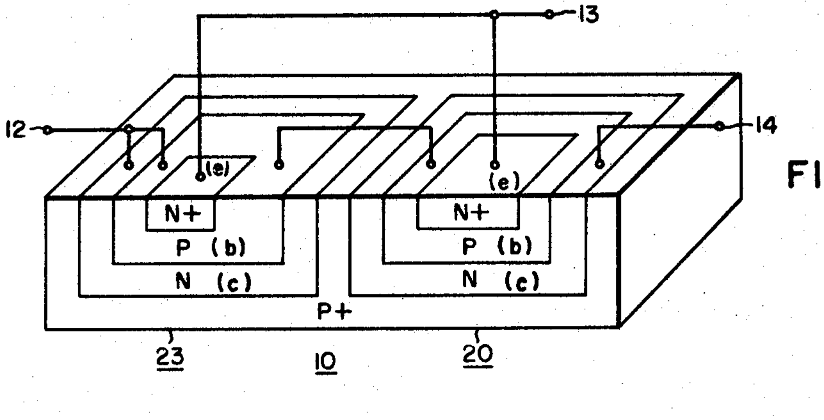

The above-stated as well as further objects and advantages of the present invention will become apparent upon a reading of the following detailed specification taken in conjunction with the drawings in which:

FIGURE 1 is a schematic diagram illustrating an embodiment of the present invention; and FIG. 2 illustrates the circuit of FIG. 1 in integrated circuit form.

In FIG. 1 the composite transistor is that circuitry enclosed by the dotted box 10, which is seen to have three leads connected to first, second and third circuit points 12, 13 and 14, respectively. The composite transistor 10 includes transistor 20 having a base electrode connected to circuit point 12, an emitter electrode connected to circuit point 13, and a collector electrode connected to circuit point 14.

Connected in parallel with the base-emitter diode of transistor 20, and between first and second circuit points 12 and 13, is a unidirectional conducting semiconductor device 23 for establishing a current path having a p-n rectifying junction so that the current therethrough may have a value which is related to the value of the emitter current of transistor 20. The ratio of these two currents determines the current gain of the composite transistor 10 ,as will be brought out subsequently.

The semiconductor device 23 preferably is a transistor having its emitter electrode connected to the emitter electrode of transistor 20, and its base electrode and collector electrode tied together and connected to first circuit point 12.

As was stated, the semiconductor device 23 is in parallel with the base-emitter diode of the transistor 20. In essence, this is equivalent to two diodes directly in parallel and since they are directly in parallel the voltage across them will be the same, and the current densities, for example in amperes per square centimeter, will be the same for both diodes. Since the semiconductor device 23 is a transistor the current therethrough will hereinafter be termed its emitter current. With equal current densities occurring at the emitter of transistor 20 and the emitter of transistor 23, the emitter current of transistor 20 and the emitter current of transistor 23 will be in the same ratio as the respective emitter areas.

The following equations will serve to illustrate that the common emitter forward current gaint $\beta^*$ of the composite transistor 10 is determined solely by the ratio of the emitter currents of transistors 20 and 23, which in turn are dependent upon the emitter areas thereof. Various currents have been labeled in FIG. 1 and are as follows:

$I_B$—base current of composite transistor 10
$I_E$—emitter current of composite transistor 10
$I_C$—collector current of both composite transistor 10 and transistor 20.
$I_{B1}$—base current of transistor 20
$I_{E1}$—emitter current of transistor 20
$I_{E2}$—emitter current of transistor 23.

For the composite transistor 10 to have a desired current gain B, that is $\beta^*=B$, the emitter area of transistor 20 is made B times the emitter area of transistor 23.

The emitter current $I_{E1}$ of transistor 20 may, to an accurate approximation, be expressed as follows:

$$I_{E1}=A_{11}^{\exp}\frac{qV_{BE}}{kT} \quad (1)$$

where $A_{11}$ is the current coefficient of the transistor 20 and is proportional to the emitter area of transistor 20,
$q$ is the electron charge,
$k$ is Boltzmann's constant
T is the absolute temperature and
$V_{BE}$ is the base-emitter voltage of transistor 20.

Similarly, $$I_{E2}=A_{22}^{\exp}\frac{qV_{BE}}{kT} \quad (2)$$

where $I_{E2}$ is the emitter current of transistor 23
$A_{22}$ is the current coefficient of transistor 23 and is proportional to the emitter area thereof $V_{BE}$ is the base-emitter voltage of transistor 23 and is equal to the $V_{BE}$ in Equation 1 since transistor 23 is connected directly in parallel with the base-emitter diode of transistor 20.

Since, for transistor 20 the emitter current $I_{E1}$ is equal to the base current $I_{B1}$ plus collector current $I_C$, and the collector current $I_C$ is equal to the base current times the current gain, the base current of transistor 20 may be expressed as $$I_{B1}=\frac{I_{E1}}{1+\beta} \qquad (3)$$

where $\beta$ is the common emitter forward current gain of transistor 20.

The base current for the composite transistor 10 is $$I_B=I_{B1}+I_{E2} \qquad (4)$$

From the above equations $$I_B=\frac{I_{E1}}{1+\beta}+I_{E2} \qquad (5)$$

$$=\frac{A_{11}^{\exp}\frac{qV_{BE}}{kT}}{1+\beta}+A_{22}^{\exp}\frac{qV_{BE}}{kT} \qquad (\;)$$

$$=\left[\frac{A_{11}}{1+\beta}+A_{22}\right]^{\exp}\frac{qV_{BE}}{kT} \qquad (7)$$

factoring out $A_{22}$ $$=\left[\frac{A_{11}/A_{22}}{1+\beta}+1\right]A_{22}^{\exp}\frac{qV_{BE}}{kT} \qquad (8)$$

Since $A_{11}$ is proportional to the emitter area of the transistor 20, and $A_{22}$ is similarly proportional to the emitter area of transistor 23, by definition $$\frac{A_{11}}{A_{22}}\equiv B \qquad (9)$$

and, therefore, $$I_B=\left[\frac{B}{1+\beta}+1\right]A_{22}^{\exp}\frac{qV_{BE}}{kT} \qquad (10)$$

The current gain of composite transistor 10 is designed to have a relatively lower common emitter current gain than the transistor 20. If the current gain $\beta$ of transistor 20 is much larger than the current gain B of composite transistor 10, the first term of Equation 10 is negligible and $$I_B=A_{22}^{\exp}\frac{qV_{BE}}{kT} \qquad (11)$$

The emitter current $I_E$ of the composite transistor is $$I_E=I_{E1}+I_{E2} \qquad (12)$$

$$I_E=(A_{11}+A_{22})^{\exp}\frac{qV_{BE}}{kT} \qquad (13)$$

$$I_E=(1+B)A_{22}^{\exp}\frac{qV_{BE}}{kT} \qquad (14)$$

From Equations 14 and 11 the ratio of emitter current to base current of the composite transistor 10 is $$\frac{I_E}{I_B}=1+B \qquad (15)$$

For the composite transistor 10 the emitter current $I_E$ is $$I_E=I_C+I_B \qquad (16)$$

and since $$I_C=I_B\beta^* \qquad (17)$$

where $\beta^*$ is the common emitter current gain of the composite transistor 10 and from Equations 16 and 17

$$\frac{I_E}{I_B}=\beta^*+1 \qquad (18)$$

and since $I_E/I_B$ also equals $1+\beta$ from Equation 15 it follows therefrom that $$B=\beta^* \qquad (19)$$

illustrating that the current gain of the composite transistor 10 is dependent solely upon the ratio of the emitter area of transistor 20 to the emitter area of transistor 23 and also the ratio of the emitter current $I_{E1}$ to the emitter current $I_{E2}$.

The composite transistor 10 of FIG. 1 may be assembled from two accurately matched transistors 20 and 23, however, it is preferable that the composite transistor 10 be fabricated as an integrated circuit so that various junctions are formed simultaneously and have the same material characteristics and responses. FIG. 2 diagrammatically illustrates an isometric view in section of a possible fabrication of composite transistor 10.

The semiconductor block of FIG. 2 includes a $P^+$ isolation wall for separating transistors 20 and 23 each of which, as illustrated, includes an n-type collector region (c), a p-type base region (b) and an n+ type emitter region (e). It is seen that the emitter area of transistor 20 in the semiconductor block is greater than the emitter area of the transistors 23, and by way of example if the emitter area of transistor 20 is five times as large as the emitter area 23, the composite transistor 10 will have a current gain of 5. Simultaneous fabrication of the junctions insures nearly identical junction depths and emitter and base region conductivities, and hence nearly identical electrical characteristics per unit emitter area.

In order to give a clearer view of the emitter areas, various connections to the semiconductor block and between the transistors have been illustrated as thin conductors. In actual practice the semiconductor block may be given an oxide coating on top, through which "windows" are etched to the various electrode areas after which a metallic coating such as aluminum may be deposited and etched away in selective areas for forming ohmic contacts.

Although the present invention has been described with a certain degree of particularity, it should be understood that the present disclosure has been made by way of example and that changes in the details of construction and combination and arrangement of parts may be resorted to without departing from the scope and spirit of the invention.

What is claimed is:

1. A constant current gain composite transistor comprising:

(A) first, second and third circuit points;

(B) a transistor having a base, emitter and collector electrode connected to said first, second and third circuit points respectively; and (C) a unidirectional conducting semiconductor device having one electrode connected to said first circuit point and another electrode connected to said second circuit point, and including a rectifying p-n junction poled in the same direction as the base-emitter diode of said transistor;

(D) said emitter electrode and said another electrode being directly connected to said second circuit point;

(E) said transistor and said unidirectional conducting semiconductor device each having a voltage-current characteristic dependent upon a respective current coefficient;

(F) the ratio of, the current coefficient of said transistor to the current coefficient of said unidirectional conducting semiconductor device, being substantially proportional to the ratio of, the area of the base-emitter junction of said transistor to the area of said rectifying junction.

2. A constant current gain composite transistor according to claim 1 wherein:

(A) the unidirectional conducting semiconductor device is a transistor having its base and collector electrodes connected together and to the first circuit point, and its emitter electrode connected to the second circuit point.

3. A constant current gain composite transistor according to claim 1 wherein:

(A) the unidirectional conducting semiconductor device is in parallel with the base-emitter diode of the transistor and the current densities in both said unidirectional conducting semiconductor device and said base-emitter diode are substantially equal.

4. A constant current gain composite transistor according to claim 1 wherein:

(A) the transistor and unidirectional semiconductor device are fabricated in the same semiconductor block.

5. A constant current gain composite transistor according to claim 1 wherein:

(A) the base-emitter diode of the transistor and the unidirectional semiconductor device are connected in a manner that the voltage across one is always equal to the voltage across the other.

6. A constant current gain composite transistor according to claim 1 wherein:

(A) the emitter area of the transistor is fabricated to be B times the rectifying junction area, where B is the desired constant gain.

References Cited

UNITED STATES PATENTS

| | | | |
|---|---|---|---|
| 3,320,439 | 5/1967 | Widlar | 307—88.5 |
| 3,327,131 | 6/1967 | Grimer | 307—88.5 |

OTHER REFERENCES

Article, S. B. Gray, "Local Feedback Improves Transistor Characteristics," Electronics, Nov. 15, 1965, p. 108.

JOHN W. HUCKERT, *Primary Examiner*.

M. H. EDLOW, *Assistant Examiner*.